US009580297B2

(12) United States Patent
Lu et al.

(10) Patent No.: US 9,580,297 B2
(45) Date of Patent: Feb. 28, 2017

(54) METHOD OF USING ALUMINUM LAYER AS ETCHING STOP LAYER FOR PATTERNING A PLATINUM LAYER

(71) Applicant: UNITED MICROELECTRONICS CORP., Hsin-Chu (TW)

(72) Inventors: Hsin-Yi Lu, Taipei (TW); Jeng-Ho Wang, Hsin-Chu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/536,686

(22) Filed: Nov. 10, 2014

(65) Prior Publication Data

US 2016/0111383 A1   Apr. 21, 2016

(30) Foreign Application Priority Data

Oct. 21, 2014 (CN) .......................... 2014 1 0561454

(51) Int. Cl.
| | | |
|---|---|---|
| *B81B 1/00* | (2006.01) | |
| *C23F 1/02* | (2006.01) | |
| *H01L 23/532* | (2006.01) | |

(52) U.S. Cl.
CPC .................. *B81B 1/00* (2013.01); *C23F 1/02* (2013.01); *H01L 23/53252* (2013.01); *H01L 23/5329* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,904,980 A | 2/1990 | Przybysz et al. | |
| 5,580,668 A * | 12/1996 | Kellam | H01L 21/288 257/E21.174 |
| 5,610,098 A * | 3/1997 | Huang | H01L 29/475 257/472 |
| 2010/0140752 A1* | 6/2010 | Marimuthu | H01L 23/3121 257/621 |
| 2014/0167263 A1* | 6/2014 | Wu | H01L 23/49816 257/741 |

OTHER PUBLICATIONS

Hsin-Yi Lu, Title of Invention: Method of Patterning Platinum Layer, U.S. Appl. No. 13/953,753, filed Jul. 30, 2013.

* cited by examiner

*Primary Examiner* — Bilkis Jahan
(74) *Attorney, Agent, or Firm* — Winston Hsu; Scott Margo

(57) ABSTRACT

A method for fabricating semiconductor device is disclosed. The method includes the steps of: providing a substrate having a dielectric layer; forming an aluminum layer on the dielectric layer; forming a platinum layer on the aluminum layer; performing a first etching process to remove part of the platinum layer and part of the aluminum layer for forming a patterned platinum layer; and performing a second etching process to remove part of the aluminum layer exposed by the patterned platinum layer and part of the dielectric layer.

10 Claims, 2 Drawing Sheets

METHOD OF USING ALUMINUM LAYER AS ETCHING STOP LAYER FOR PATTERNING A PLATINUM LAYER

BACKGROUND OF THE INVENTION

1. Field of the Invention

The invention relates to a method for fabricating semiconductor device, and more particularly to a method of using aluminum layer as etching stop layer for patterning a platinum layer.

2. Description of the Prior Art

Along with the development of technology and the improvement of the semiconductor techniques, electronic devices are widely used in modern life. Micro-electromechanical system (MEMS) technology is used to fabricate micro mechanical devices by using conventional semiconductor technologies like electroplating, or etching, such that a mechanical component in a micro-meter scale may be formed. The MEMS devices may be applied, for example, in the voltage controlling component in an ink printer, the gyroscope in a car to detect the tilt of the car, the vibration membrane in a microphone to sense a sound, or the micro-heaters in air detectors, chemical detectors, and polymerase chain reaction (PCR) biological chips to provide a local heating function. The MEMS technology which combines the fabrication process of the mechanical and the electronic devices has the advantages of low costs, high performances and high density.

Platinum (Pt), the promising material, can be widely used in very-large-scale integration (VLSI) and MEMS field as electro-thermal, humidity and gas sensor due to its chemical stability and excellent oxidation resistance. Pt also has a high work function and forms a high potential barrier against electron transfer at the interface with the dielectric material, which may suppress leakage current. However, etching process used for patterning platinum in current fabrication is unable to be controlled effectively thereby influencing the uniformity of the product and inducing the loss of the dielectric layer underneath. Hence, how to resolve this issue and improve the current fabrication for patterning platinum has become an important task in this field.

SUMMARY OF THE INVENTION

According to a preferred embodiment of the present invention, a method for fabricating semiconductor device is disclosed. The method includes the steps of: providing a substrate having a dielectric layer; forming an aluminum layer on the dielectric layer; forming a platinum layer on the aluminum layer; performing a first etching process to remove part of the platinum layer and part of the aluminum layer for forming a patterned platinum layer; and performing a second etching process to remove part of the aluminum layer exposed by the patterned platinum layer and part of the dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
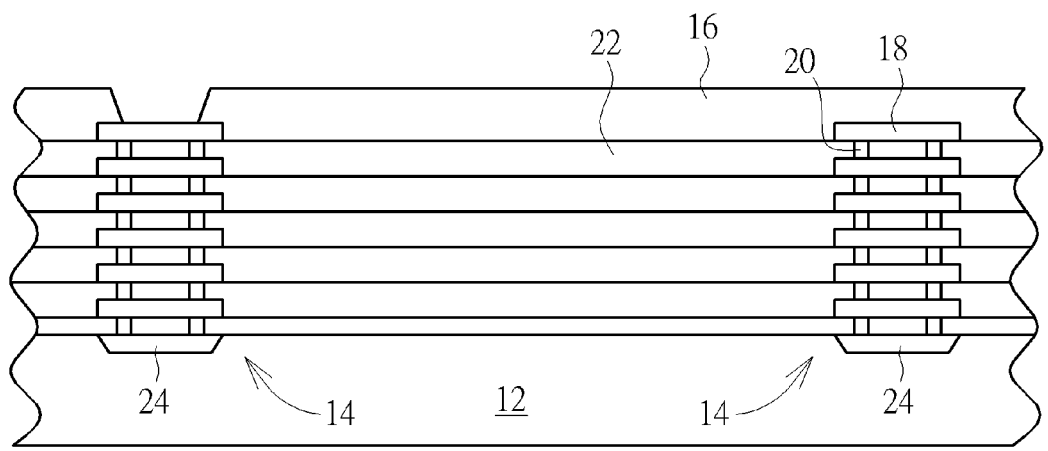
FIGS. 1-4 are schematic diagrams illustrating a method for fabricating semiconductor device according to a preferred embodiment of the present invention.

Referring to FIGS. 1-4, FIGS. 1-4 are schematic diagrams illustrating a method for fabricating semiconductor device according to a preferred embodiment of the present invention. As shown in FIG. 1, a substrate 12, such as a substrate composed of Si, AsGa, silicon on insulator (SOI) layer, an epitaxial layer, a SiGe layer or other semiconductor materials is provided. The substrate 12 preferably includes a conductive element stack 14 and at least one dielectric layer 16 on the conductive element stack 14, in which the conductive element stack 14 could further be composed of metal layers 18, via conductors 20, inter-metal dielectric layers 22, and conductive regions 24. In this embodiment, the conductive element stack 14 could be fabricated by dual damascene process, and the dielectric layer 16 is preferably composed of low dielectric constant (low-K) material (K value smaller than 3.9), ultra low-K (ULK) material (K value smaller than 2.6), or porous ULK material. The dielectric layer 16 of this embodiment is composed of silicon oxide, but not limited thereto. The number of layers within the conductive element stack 14, including the quantity of the metal layers 18 and via conductors 20 are not limited to the ones disclosed in this embodiment, but could be adjusted depending on the demand of the product. Since the formation of conductive element stacks 14 and dielectric layer 16 is well known to those skilled in the art, the details of which are not explained herein for the sake of brevity.

Figure 2:
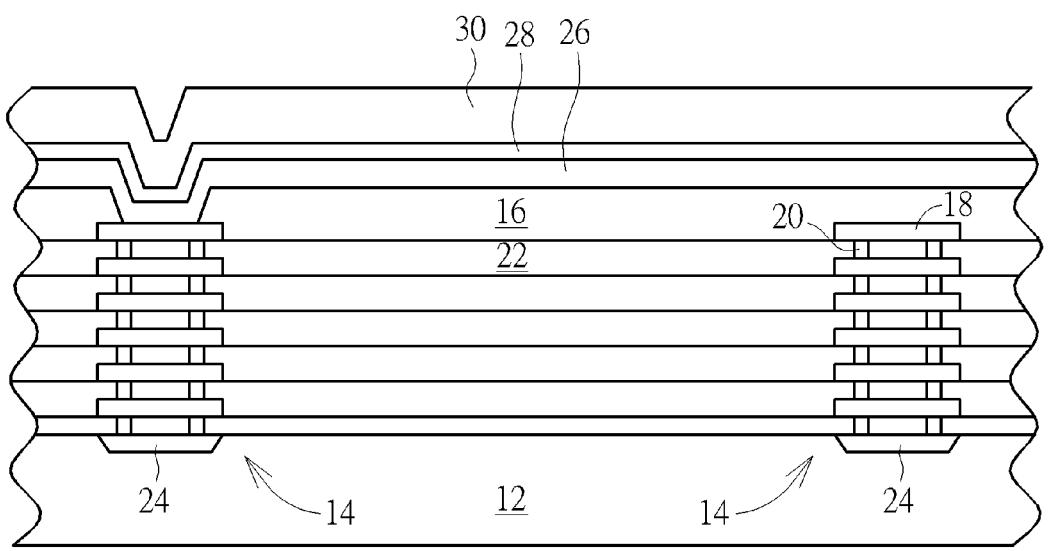

Next, as shown in FIG. 2, an aluminum layer 26 is formed on the dielectric layer 16, a barrier layer 28 is formed on the aluminum layer 26, and a platinum layer 30 is formed on the barrier layer 28. In this embodiment, the barrier layer 28 is selected from the group consisting of Ti, TiN, Ta, and TaN, but not limited thereto. A thickness ratio of aluminum layer 26 to platinum layer 30 is preferably greater than 30%, in which the thickness of the aluminum layer 26 is between 300-1000 Angstroms, and the thickness of the platinum layer 30 is approximately 1000 Angstroms. It should be noted that despite a barrier layer 28 is disposed between the aluminum layer 26 and platinum layer 30 in this embodiment, it would also be desirable to omit the formation of barrier layer 28 and disposed the platinum layer 30 directly on the surface of the aluminum layer 26, which is also within the scope of the present invention.

Figure 3:
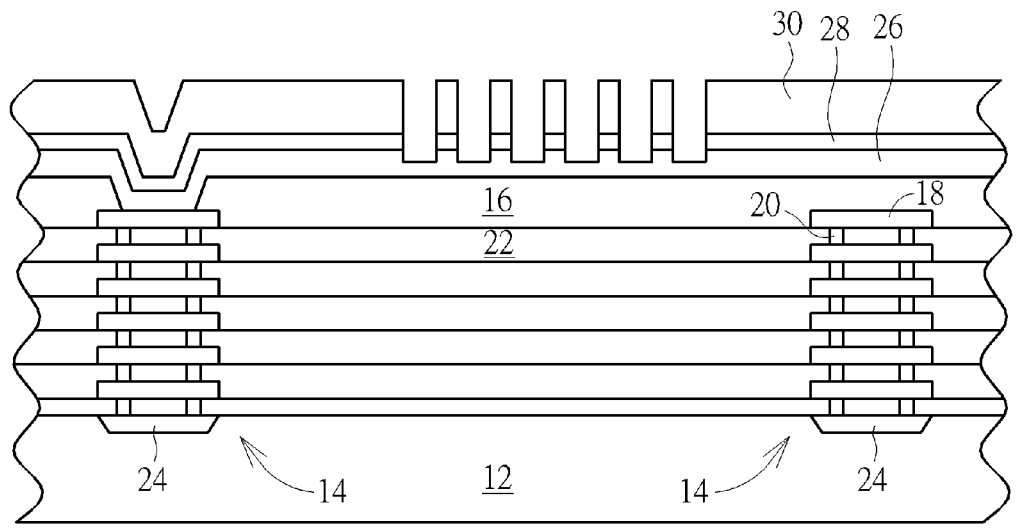

Next, as shown in FIG. 3, a first etching process is conducted to remove part of the platinum layer 30, part of the barrier layer 28, and part of the aluminum layer 26 for forming a patterned platinum layer 30 and a patterned barrier layer 28. In this embodiment, the first etching process is accomplished by first forming a patterned resist (not shown) on the platinum layer 30, and then using the patterned resist as etching mask to remove part of the platinum layer 30 and part of the barrier layer 28. Next, the aluminum layer 26 is used as an etching stop layer so that the first etching process would stop on the aluminum layer 26 without damaging the dielectric layer 16 underneath during the removal of platinum layer 30 and barrier layer 28. Preferably, a gas selected from the group consisting of $Cl_2$ and $CHF_3$ is utilized for performing the first etching process, but not limited thereto.

Figure 4:
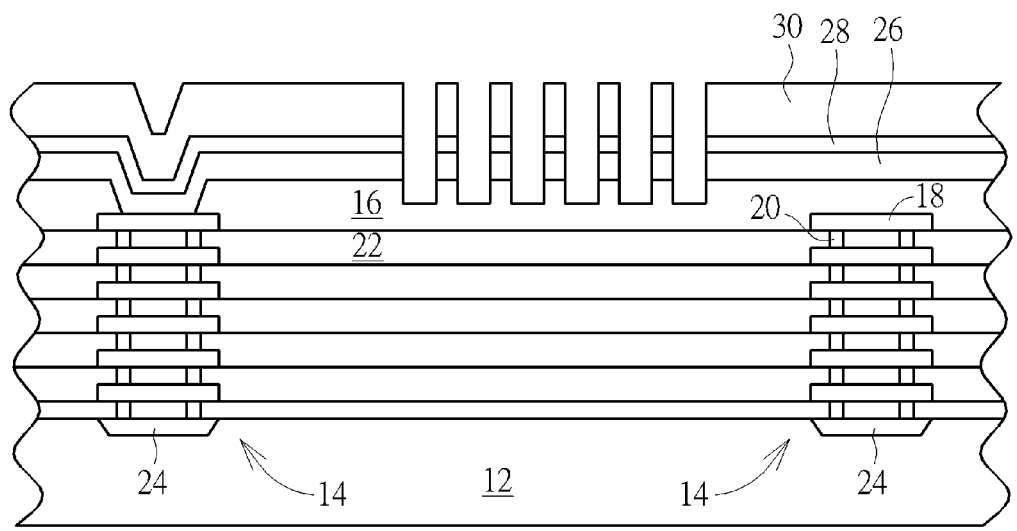

Next, as shown in FIG. 4, a second etching process is conducted to remove part of the aluminum layer 26 exposed by the patterned platinum layer 30 and part of the dielectric layer 16 for forming a patterned aluminum layer 26. In this embodiment, the second etching process could be conducted by using the same patterned resist used in the first etching process as etching mask to remove part of the aluminum layer 26 and part of the dielectric layer 16, or could be conducted by first removing the patterned resist, and then using the patterned platinum layer 30 directly as etching mask to remove part of the aluminum layer 26 and dielectric layer 16, which are all within the scope of the present invention. Preferably, the loss of the dielectric layer 16 after the etching process is less than 600 Angstroms, and a gas selected from the group consisting of $Cl_2$ and $BCl_3$ is utilized for performing the second etching process. This completes the method for fabricating semiconductor device according to a preferred embodiment of the present invention.

Referring again to FIG. 4, FIG. 4 further illustrates a structural view of a semiconductor device according to an embodiment of the present invention. The semiconductor device includes a substrate 12, a conductive element stack 14 on the substrate 12, a dielectric layer 16 on the conductive element stack 14, an aluminum layer 26 on the dielectric layer 16, a platinum layer 30 on the aluminum layer 26, and a barrier layer 28 between the aluminum layer 26 and platinum layer 30. Despite the barrier layer 28 is disposed between the aluminum layer 26 and platinum layer 30 and directly contact the aluminum layer 26 and platinum layer 30 in this embodiment, it would also be desirable to omit the barrier layer 28 so that the platinum layer 30 would contact the aluminum layer 26 directly, which is also within the scope of the present invention. It should be noted that that since the platinum layer 30, barrier layer 28, and aluminum layer 26 are preferably patterned by the same patterned resist through pattern transfer process, these three layers 26, 28, and 30 preferably have identical pattern. Additionally, the dielectric layer 16 in this embodiment is composed of silicon oxide and the barrier layer 28 is selected from the group consisting of Ti, TiN, Ta, and TaN, but not limited thereto.

Overall, in contrast to the conventional art of using barrier layer consisting of TiN as etching stop layer during the patterning of platinum layer, the present invention uses an aluminum layer as etching stop layer during the patterning of platinum layer to control the accuracy and precision of the etching process so that not only the uniformity of both central and peripheral region of the wafer is increased, but also the loss of dielectric layer underneath the aluminum layer is minimized. Preferably, the patterns including patterned platinum layer and patterned aluminum layer fabricated by aforementioned process could be used in various sensor applications, including alcohol sensors used for detecting alcohol level in drinking and driving as well as sensors used in DNA inspection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate, wherein the substrate comprises a dielectric layer, the dielectric layer comprises a recessed opening, and a top surface of the dielectric layer corresponding to the recessed opening is exposed;
   an aluminum layer on the dielectric layer; and
   a platinum layer on and cover the aluminum layer entirely, wherein the aluminum layer comprises a patterned aluminum layer, the platinum layer comprises a patterned platinum layer, and the patterned aluminum layer and the patterned platinum layer comprise a same pattern.

2. The semiconductor device of claim 1, further comprising a barrier layer between the aluminum layer and the platinum layer.

3. The semiconductor device of claim 2, wherein the barrier layer is selected from the group consisting of Ti, TiN, Ta, and TaN.

4. The semiconductor device of claim 2, wherein the platinum layer and the aluminum layer contact the barrier layer directly.

5. The semiconductor device of claim 1, further comprising a conductive element stack under the dielectric layer.

6. The semiconductor device of claim 1, wherein the dielectric layer comprises silicon oxide.

7. The semiconductor device of claim 1, wherein the aluminum layer and the platinum layer comprises same pattern.

8. The semiconductor device of claim 1, wherein the platinum layer contacts the aluminum layer directly.

9. The semiconductor device of claim 1, wherein a thickness ratio of aluminum layer to platinum layer is greater than 30%.

10. A semiconductor device, comprising:
    a substrate, wherein the substrate comprises a dielectric layer and the dielectric layer comprises a recessed opening;
    an aluminum layer on the dielectric layer;
    a platinum layer on and cover the aluminum layer entirely, wherein the aluminum layer comprises a patterned aluminum layer, the platinum layer comprises a patterned platinum layer, and the patterned aluminum layer and the patterned platinum layer comprise a same pattern; and
    a barrier layer between the patterned aluminum layer and the patterned platinum layer, wherein the barrier layer, the patterned aluminum layer and the patterned platinum layer comprise the same pattern.

* * * * *